United States Patent
Higgins, III et al.

(10) Patent No.: US 9,111,878 B2
(45) Date of Patent: Aug. 18, 2015

(54) METHOD FOR FORMING A SEMICONDUCTOR DEVICE ASSEMBLY HAVING A HEAT SPREADER

(71) Applicants: Leo M. Higgins, III, Austin, TX (US); Burton J. Carpenter, Austin, TX (US)

(72) Inventors: Leo M. Higgins, III, Austin, TX (US); Burton J. Carpenter, Austin, TX (US)

(73) Assignee: FREESCALE SEMICONDUCTOR, INC, Austin, TX (US)

( * ) Notice: Subject to any disclaimer, the term of this patent is extended or adjusted under 35 U.S.C. 154(b) by 31 days.

(21) Appl. No.: 13/755,904

(22) Filed: Jan. 31, 2013

(65) Prior Publication Data

US 2014/0213018 A1    Jul. 31, 2014

(51) Int. Cl.
*H01L 21/00* (2006.01)
*H01L 23/31* (2006.01)
*H01L 21/56* (2006.01)
*H01L 23/36* (2006.01)
*H01L 23/42* (2006.01)

(52) U.S. Cl.
CPC .......... *H01L 23/3121* (2013.01); *H01L 21/565* (2013.01); *H01L 23/36* (2013.01); *H01L 23/42* (2013.01); *H01L 2224/48091* (2013.01); *H01L 2224/73265* (2013.01)

(58) Field of Classification Search
CPC ................. H01L 2224/48465; H01L 23/3121
See application file for complete search history.

(56) References Cited

U.S. PATENT DOCUMENTS

| | | | |
|---|---|---|---|
| 6,146,921 A | 11/2000 | Barrow | |
| 6,335,862 B1 * | 1/2002 | Koya | 361/708 |
| 7,141,886 B2 * | 11/2006 | Dimaano et al. | 257/796 |
| 8,258,016 B2 * | 9/2012 | Ito et al. | 438/118 |
| 2003/0216024 A1 * | 11/2003 | Shim et al. | 438/613 |
| 2004/0087061 A1 * | 5/2004 | Ma et al. | 438/122 |
| 2006/0267182 A1 * | 11/2006 | Rumer et al. | 257/706 |
| 2012/0012156 A1 * | 1/2012 | Linderman et al. | 136/246 |

OTHER PUBLICATIONS

U.S. Appl. No. 13/403,458, filed Feb. 23, 2012.
U.S. Appl. No. 13/485,912, filed May 31, 2012.

* cited by examiner

*Primary Examiner* — Zandra Smith
*Assistant Examiner* — Andre' C Stevenson

(57) ABSTRACT

A method includes providing an integrated circuit (IC) die assembly that includes a substrate and an IC die mounted on a portion of a major surface of the substrate, dispensing an interface material on the IC die, positioning a portion of a heat spreader in contact with the interface material, and dispensing an adhesive between one side of the heat spreader facing the IC die assembly and exposed portions of a major surface of an encapsulant on the substrate.

19 Claims, 3 Drawing Sheets

METHOD FOR FORMING A SEMICONDUCTOR DEVICE ASSEMBLY HAVING A HEAT SPREADER

BACKGROUND

1. Field

This disclosure relates generally to semiconductor device packaging, and more specifically, to a method for forming a semiconductor device assembly having a heat spreader.

2. Related Art

Heat is generated by an integrated circuit (IC) die during operation. If inadequately removed, the heat generated by the die may cause the device to fail or to perform erratically. As such, heat spreaders are often incorporated into semiconductor packages to improve the thermal performance of the IC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Heat spreaders are often used in semiconductor device assemblies to improve thermal performance. In one such known device assembly, a thermal interface material is applied to the surface of the die and an adhesive material is applied to the surface of the mold compound surrounding a peripheral portion of the die. Subsequent to the application of the thermal interface material and the adhesive material, the heat sink is attached to the surface of the die and adhesively bonded to the mold compound. However, this type of device assembly requires careful process control to achieve the desired interface between the heat sink and the die as well as the heat sink and the mold compound. Therefore, in one embodiment, as will be described below in reference to FIGS. 1-8, control of the heat sink to die bonding is decoupled from the control of the adhesive attachment of the periphery of the heat sink to the mold compound. In this manner, tighter control may be achieved for the interface between the heat sink and die.

Figure 1:
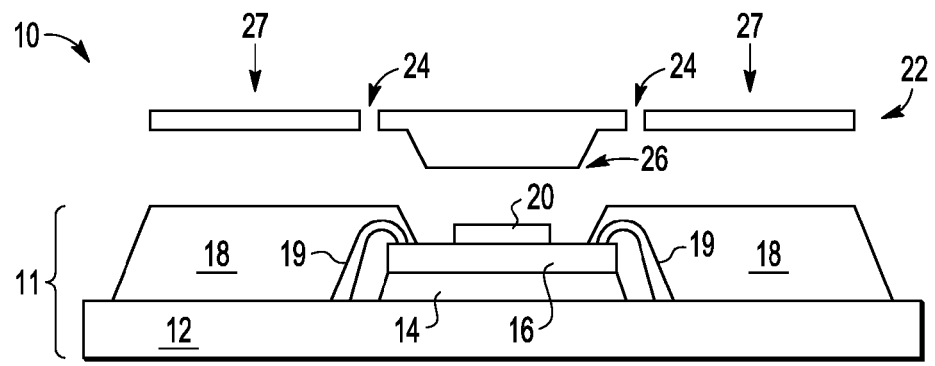
FIG. 1 illustrates a cross sectional view of a semiconductor device assembly at a stage in processing, in accordance with one embodiment of the present disclosure.

FIG. 1 illustrates a semiconductor device assembly 10 at a stage in processing in accordance with one embodiment. Semiconductor device assembly 10 includes a semiconductor die assembly 11 (also referred to as an integrated circuit (IC) die assembly) and a heat spreader 22, in which, in the illustration of FIG. 1, heat spreader 22 has not yet been attached to semiconductor die assembly 11. Semiconductor die assembly 11 includes a package substrate 12, a semiconductor die 16 attached to package substrate 12 by way of die attach 14, and electrical connections 19 which route electrical signals between die 16 and package substrate 12. In one embodiment, electrical connections 19 are implemented as wire bonds. Semiconductor die assembly 11 also includes a mold compound 18 (also referred to as an encapsulant) surrounding a peripheral portion of die 16. Mold compound 18 covers electrical connections 19 and extends from the peripheral portion of die 16 over a surface of package substrate 12. Mold compound 18 is also formed so as to expose a top major surface of die 16. In one embodiment, film assisted molding may be used to form mold compound 18. Alternatively, semiconductor die assembly 11 may be a flip chip assembly in which die 16 is attached to package substrate 12 by way of solder balls, where the solder balls provide the electrical connections to communicate signals between die 16 and substrate 12. Furthermore, mold compound 18 may extend higher than die 16, as illustrated in FIG. 1, or alternatively, mold compound 18 may be substantially coplanar with the top major surface of die 16.

An interface material 20 is applied to the exposed top surface of die 16 of die assembly 11. Interface material 20 may be a thermal interface material (TIM). Interface material 20 may also be an adhesive material. FIG. 1 also illustrates heat spreader 22 prior to attachment to die assembly 11. Heat spreader 22 includes a pedestal portion 26 which will contact the exposed top surface of die 16 by way of interface material 20, and a periphery portion 27 which extends from pedestal portion 26 to cover at least a portion of mold compound 18. Heat spreader 22 also includes openings 24, which may be referred to as vents or vent openings), surrounding pedestal portion 26. Openings 24 extend from one major surface of heat spreader 22 to an opposite major surface of heat spreader 22.

Figure 5:
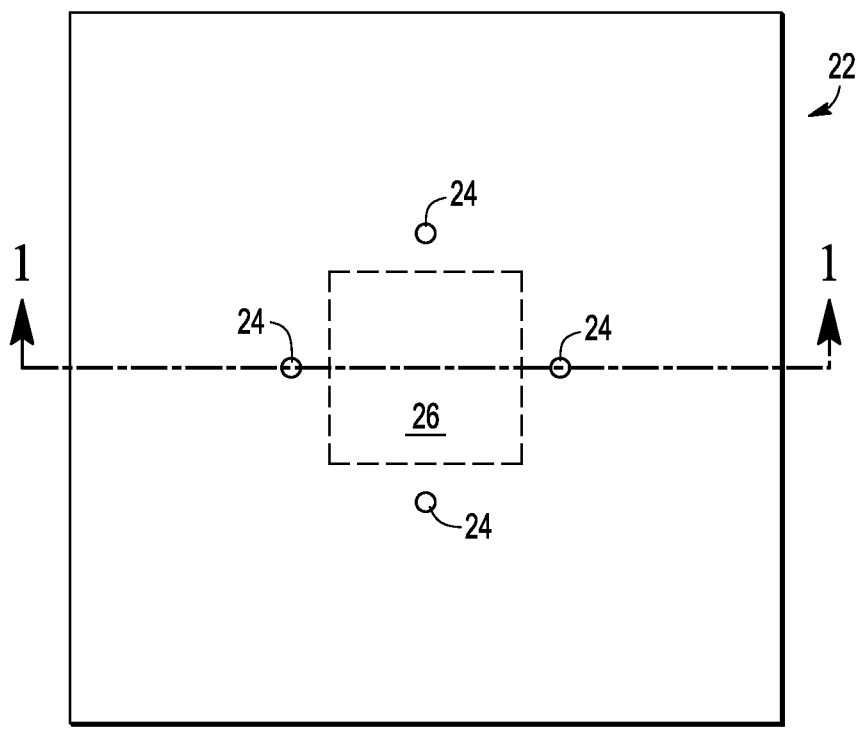
FIG. 5 illustrates a top down view of the heat spreader of FIG. 1 in accordance with one embodiment of the present disclosure.

FIG. 5 illustrates a top down view of heat spreader 22, prior to attachment to die assembly 11. Note that pedestal portion 26 is indicated by a dotted line. In the illustrated embodiment, heat spreader 22 includes one vent opening 24 at each side of pedestal portion 26 (and thus on each side of die 16 after attachment to device assembly 11). Heat spreader 22 may therefore include at least one opening 24 around an outer perimeter of pedestal 26. In alternate embodiments, fewer or additional openings 24 may be present. As will be described below, openings 24 aid in forming an adhesive between heat spreader 22 and device assembly 11 after attachment. However, in alternate embodiments, note that heat spreader 22 may not include any openings 24. Heat spreader 22 may be formed of any thermally conductive material, such as a metal. For example, heat spreader 22 may be copper or nickel plated copper. As seen in the illustrated embodiment of FIG. 1, pedestal portion 26 is a downset portion that extends towards the die. In the illustrated embodiment, pedestal portion 26 of heat spreader 22 is thicker than periphery portion 27 of heat spreader 22. Alternatively, heat spreader 22 may be formed by stamping such that pedestal portion 26 is down set from the periphery portion 27 of heat spreader 22. Note that the thickness or down set distance of pedestal portion 26 depends on how much mold compound 18 extends higher than the top major surface of die 16 from package substrate 12. That is, pedestal portion 26 should be sufficiently downset so as to be able to contact the top major surface of die 16 or be within a predetermined distance of the top major surface of die 16. In an embodiment in which mold compound 18 is substantially coplanar with the top major surface of die 16, pedestal portion 26 may extend upwards in comparison to periphery portion 27 so as to allow a greater thickness of interface material 20.

Figure 2:
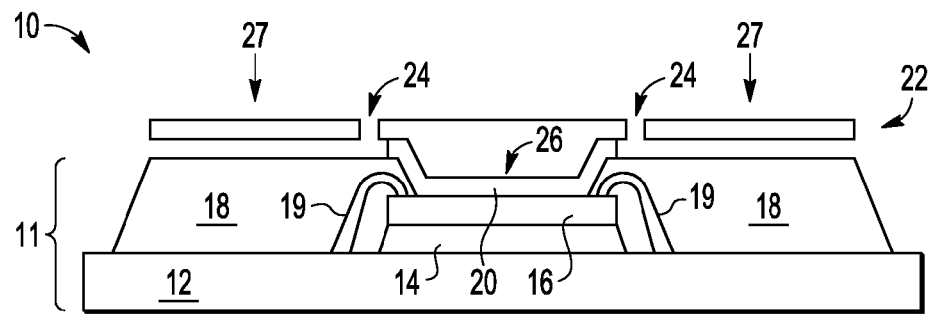
FIG. 2 illustrates a cross sectional view of the semiconductor device assembly of FIG. 1 at a subsequent stage in processing, in accordance with one embodiment of the present disclosure.

FIG. 2 illustrates device assembly 10 after heat spreader 22 is mounted onto die assembly 11. Pedestal portion 26 is positioned so as to contact interface material 20 such that heat spreader 22 is in contact with the exposed portion of die 16 by way of interface material 20. Also, note that pedestal 26 is positioned inside a perimeter of the wire bonds (electrical connections 19). Pressure may be applied to heat spreader 22 and/or die assembly 11 to bring heat spreader 22 closer to die assembly 11 so as to establish a target, or predetermined, gap distance between the top surface of die 16 and a bottom surface of pedestal portion 26 of heat spreader 22. In one embodiment, this gap distance is in a range of 25 to 50 micrometers, or preferably, between 34 and 40 micrometers. Therefore, note that interface material 20 spreads within this gap and may also cover portions of mold compound 18. Since interface material 20 is between pedestal portion 26 and die assembly 11, the target gap distance also corresponds to the target, or predetermined, thickness of interface material 20 between heat spreader 22 and die assembly 11. However, the amount of interface material 20 placed onto device assembly 11 is controlled so that, upon bringing heat spreader 22 into contact with interface material 20, interface material 20 does not extend to openings 24. That is, openings 24 continue to expose portions of mold compound 18. Also, note that no adhesive is present on mold compound 18 prior to contacting heat spreader 22 with interface material 20. Therefore, an air gap is present between the peripheral portion of heat spreader 22, surrounding pedestal 26, and mold compound 18.

Figure 3:
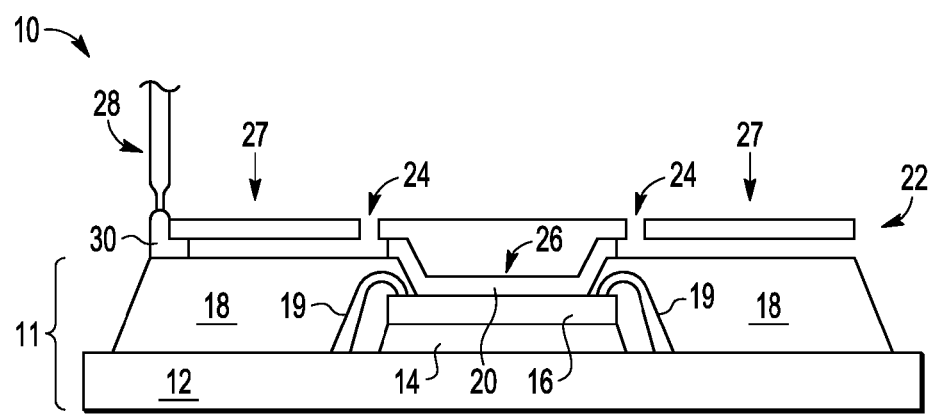
FIG. 3 illustrates a cross sectional view of the semiconductor device assembly of FIG. 2 at a subsequent stage in processing, in accordance with one embodiment of the present disclosure.
Figure 4:
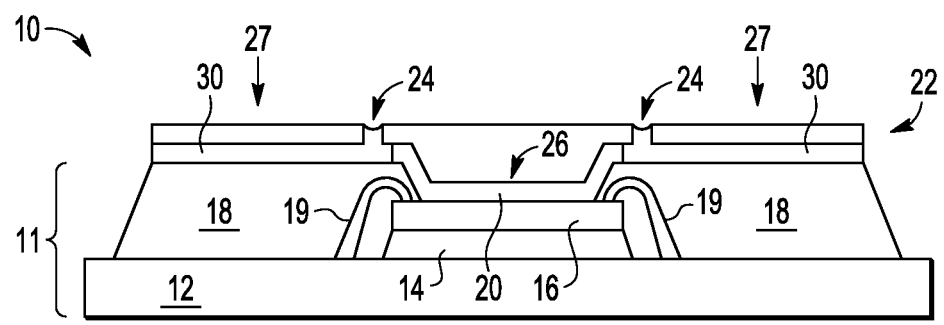
FIG. 4 illustrates a cross sectional view of the semiconductor device assembly of FIG. 3 at a subsequent stage in processing, in accordance with one embodiment of the present disclosure.

FIG. 3 illustrates device assembly 10 at a subsequent stage in processing in which, after heat spreader 22 has been placed in contact with interface material 20 and the gap between pedestal 26 and the top surface of die 16 is at the desired distance, an adhesive 30 is dispensed by a nozzle 28 at an edge of heat spreader 22. As illustrated in FIG. 4, adhesive 30 flows through capillary action to fill the air gap between heat spreader 22 and mold compound 18. In one embodiment, adhesive 30 is dispensed around one or more edges of heat spreader 22. Vent openings 24 aid the capillary flow to ensure that adhesive 30 reaches interface material 20 while air is vented through openings 24. In one embodiment, adhesive 30 completely contacts and surrounds interface material 20 between heat spreader 22 and die assembly 11. Also, note that within the gap between periphery portion 27 of heat spreader 22 and mold compound 18, adhesive 30 contacts both the bottom major surface of heat spreader 22 and the top major surface of mold compound 18. Therefore, the gap distance between pedestal portion 26 of heat spreader 22 and the top major surface of die 16 can be controlled as needed, and the subsequent application of adhesive 30 does not affect this gap distance. In this manner, the application of adhesive 30 is decoupled from the control of the gap distance between pedestal portion 26 and die 16.

In one embodiment, adhesive 30 is an adhesive that is flowable by capillary action. This may include, for example, underfill materials used for flip chip assemblies or surface mount assemblies of ball grid arrays. In one embodiment, adhesive 30 may have thermally enhanced properties. Interface material 20 is a different material than adhesive 30. Therefore, interface material 20 may have different thermal properties and/or different mechanical properties than adhesive 30. While both may have desirable adhesive properties and/or thermal properties, the thermal properties are more important than the adhesive properties for interface material 20, but the adhesive properties are more important than the thermal properties for adhesive 30. That is, the primary function of interface material 20 is to conduct heat while the primary function of adhesive 30 is to ensure that heat spreader 22 is reliably attached to die assembly 11.

After application of adhesive 30, completed device assembly 10 may be cured. In one embodiment, curing may be optimized for one of adhesive 30 or interface material 20.

Figure 6:
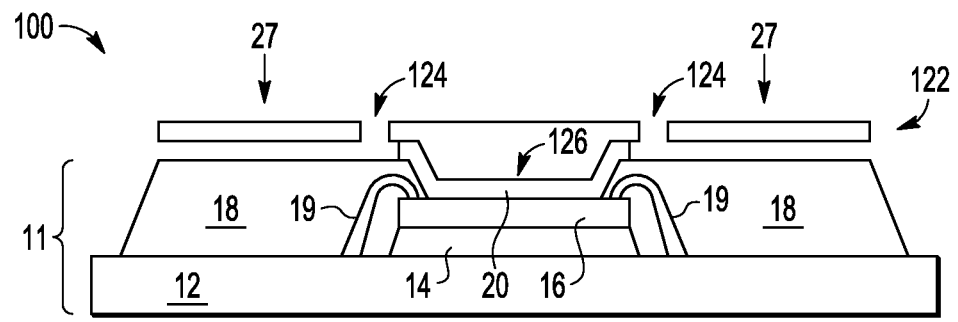
FIG. 6 illustrates a cross sectional view of a semiconductor device assembly at a stage in processing, in accordance with one embodiment of the present disclosure.

FIG. 6 illustrates a device assembly 100 in which a different heat spreader 122 is brought into contact with interface material 20 of die assembly 11. Heat spreader 122 is similar to heat spreader 22, but heat spreader 122 includes openings 124 which are larger than openings 24. As will be described below, openings 124 will be used to apply an adhesive. As with assembly 10, note that, upon contacting heat spreader 122 with interface material 20, no adhesive is present between mold compound 18 and heat spreader 122.

Figure 7:
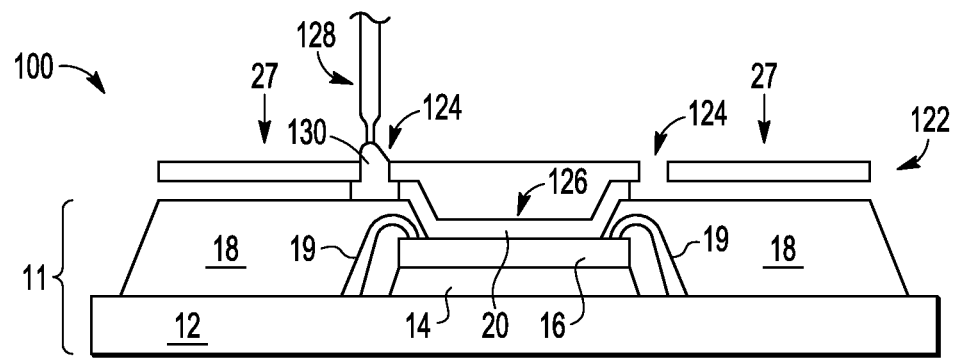
FIG. 7 illustrates a cross sectional view of the semiconductor device assembly of FIG. 6 at a subsequent stage in processing, in accordance with one embodiment of the present disclosure.
Figure 8:
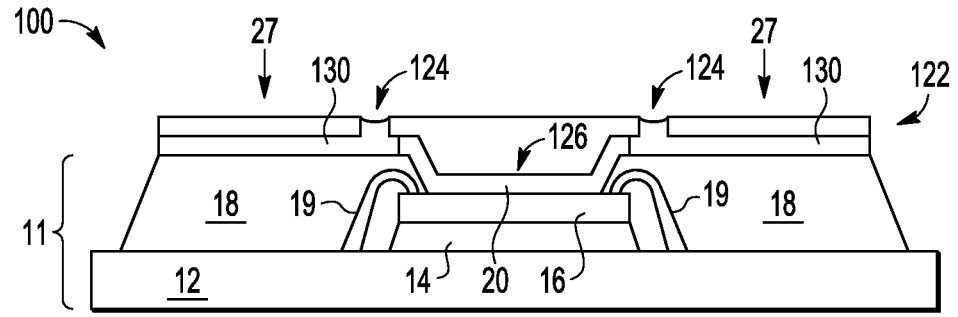
FIG. 8 illustrates a cross sectional view of the semiconductor device assembly of FIG. 7 at a subsequent stage in processing, in accordance with one embodiment of the present disclosure.

FIG. 7 illustrates device assembly 100 in which at a subsequent stage in processing in which, after heat spreader 122 has been placed in contact with interface material 20 and the gap between pedestal 126 and the top surface of die 16 is at the desired target distance, an adhesive 130 is dispensed by a nozzle 128 through an opening 124. As illustrated in FIG. 8, adhesive 130 flows through capillary action to fill the air gap between heat spreader 122 and mold compound 18. Openings 124 may also aid in the capillary action to ensure that adhesive 130 fills enough of the air gap between heat spreader 122 and mold compound 18. Heat spreader 122 may include any number of openings 124, and openings 124 may be located anywhere within heat spreader 122 and may have any size and shape. In one embodiment, adhesive 130 completely contacts and surrounds interface material 20 between heat spreader 122 and die assembly 11. In this manner, the gap distance between pedestal portion 126 of heat spreader 122 and the top major surface of die 16 can be controlled as needed, and the subsequent application of adhesive 130 does not affect this gap distance. That is, the application of adhesive 130 is decoupled from the control of the gap distance between pedestal portion 126 and die 16.

After application of adhesive 130, completed device assembly 100 may be cured. In one embodiment, curing may be optimized for one of adhesive 130 or interface material 20.

Note that the same descriptions provided for the formation of heat spreader 22 also apply analogously to heat spreader 122, and the descriptions provided for adhesive 30 also apply analogously to adhesive 130.

Therefore, by now it should be appreciated that there has been provided a method for forming a device assembly in which the adhesive material is applied to the assembly after the heat spreader has been brought into contact to an exposed major surface of the die by way of an interface material. In this manner, the control of the interface between the heat spreader and major surface of the die is not affected by the application of the adhesive. Improved manufacturing control may therefore be achieved.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, this method may apply to a variety of different die assembly configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method which includes providing an integrated circuit (IC) die assembly that includes a substrate and an IC die mounted on a portion of a major surface of the substrate; dispensing a thermal interface material on the IC die; positioning a portion of a heat spreader in contact with the thermal interface material; and dispensing an adhesive between one side of the heat spreader facing the IC die assembly and exposed portions of a major surface of an encapsulant on the substrate. Item 2 includes the method of item 1, and further includes curing the adhesive. Item 3 includes the method of item 1, and further includes curing the adhesive and the interface material. Item 4 includes the method of item 1, wherein the dispensing the adhesive is dispensed around edges of the heat spreader. Item 5 includes the method of item 1, wherein the heat spreader includes a pedestal that contacts the thermal interface material, and at least one vent through the heat spreader around an outer perimeter of the pedestal. Item 6 includes the method of item 4, wherein the dispensing the adhesive is performed using a nozzle that dispenses the adhesive through the vent of the heat spreader. Item 7 includes the method of item 1, wherein the dispensing the adhesive is performed so that the adhesive is in contact with encapsulant on the substrate and at least a portion of the one side of the heat spreader. Item 8 includes the method of item 1, wherein the portion of the heat spreader in contact with the interface material is a downset portion, the downset portion is positioned over the IC die inside a perimeter of wire bonds attached between the IC die and the substrate.

Item 9 includes a method, which includes attaching a semiconductor die to a substrate; forming wire bonds between the die and the substrate; encapsulating the wire bonds with a mold compound, wherein the mold compound is configured to expose a top surface of the die that does not include the wire bonds; applying a first adhesive over the top surface of the die; contacting a portion of a heat spreader to the first adhesive; and dispensing a second adhesive so that the second adhesive fills a gap between a first side of the mold compound and a first side of the heat spreader. Item 10 includes the method of item 9, wherein the contacting the portion of the heat spreader includes applying pressure to between the heat spreader and the substrate to establish a predetermined thickness of the first adhesive. Item 11 includes the method of item 9, wherein the first adhesive is a thermal interface material and the second adhesive is a material flowable by capillary action. Item 12 includes the method of item 9, wherein the dispensing the second adhesive includes dispensing the second adhesive around a perimeter of the heat spreader so that the second adhesive flows in the gap and is in contact with the first side of the mold compound and the first side of the heat spreader. Item 13 includes the method of item 9, wherein the heat spreader includes a vent through a cross-section that is outside the portion of the heat spreader that is in contact with the first adhesive. Item 14 includes the method of item 13, wherein the dispensing the second adhesive includes dispensing the second adhesive in the vent so that the second adhesive flows in the gap and is in contact with the first side of the mold compound and the first side of the heat spreader. Item 15 includes the method of item 9, and further includes curing the first and second adhesives. Item 16 includes the method of item 13, wherein the portion of the heat spreader that is in contact with the first adhesive is a downset portion that extends toward the die from the first side of the heat spreader.

Item 17 includes a method which includes applying a first interface material on an exposed portion of an integrated circuit (IC) die mounted on a substrate; mounting a first portion of a heat spreader on the IC die using an interface material, the heat spreader having an opening through a second portion of the heat spreader that is outside of the first portion of the heat spreader; and dispensing an adhesive between a first side of the heat spreader and a surface of an encapsulant on the substrate, wherein the interface material is different than the adhesive. Item 18 includes the method of item 17, wherein the interface material has one of a group consisting of: different thermal properties than the adhesive and different mechanical properties than the adhesive. Item 19 includes the method of item 17, wherein the adhesive is dispensed by one of a group consisting of: around an edge of the heat spreader, and through the opening of the heat spreader. Item 20 includes the method of item 17, further comprising using capillary action to move the adhesive between the encapsulant and the first side of the heat spreader.

What is claimed is:

1. A method comprising:
    providing an integrated circuit (IC) die assembly that includes a substrate and an IC die mounted on a portion of a major surface of the substrate;
    dispensing a thermal interface material on the IC die;
    positioning a portion of a heat spreader in contact with the thermal interface material; and
    after the positioning the portion of the heat spreader in contact with the thermal interface, dispensing an adhesive between one side of the heat spreader facing the IC die assembly and exposed portions of a major surface of an encapsulant on the substrate wherein the dispensing the adhesive is performed so that the adhesive is in contact with the major surface of the encapsulant on the substrate and at least a portion of the one side of the heat spreader.

2. The method of claim 1, further comprising curing the adhesive.

3. The method of claim 1, further comprising curing the adhesive and the interface material.

4. The method of claim 1, wherein the dispensing the adhesive is dispensed around edges of the heat spreader.

5. The method of claim 1, wherein the heat spreader includes:
a pedestal that contacts the thermal interface material, and
at least one vent through the heat spreader around an outer perimeter of the pedestal.

6. The method of claim 4, wherein the dispensing the adhesive is performed using a nozzle that dispenses the adhesive through the vent of the heat spreader.

7. The method of claim 1, wherein the portion of the heat spreader in contact with the interface material is a downset portion, the downset portion is positioned over the IC die inside a perimeter of wire bonds attached between the IC die and the substrate.

8. A method comprising:
attaching a semiconductor die to a substrate;
forming wire bonds between the die and the substrate;
encapsulating the wire bonds with a mold compound, wherein the mold compound is configured to expose a top surface of the die that does not include the wire bonds;
after the encapsulating, applying a first adhesive over the top surface of the die;
after the applying the first adhesive, contacting a portion of a heat spreader to the first adhesive; and
dispensing a second adhesive so that the second adhesive fills a gap between a first side of the mold compound and a first side of the heat spreader.

9. The method of claim 8, wherein the contacting the portion of the heat spreader includes applying pressure to between the heat spreader and the substrate to establish a predetermined thickness of the first adhesive.

10. The method of claim 8, wherein the first adhesive is a thermal interface material and the second adhesive is a material flowable by capillary action.

11. The method of claim 8, wherein the dispensing the second adhesive includes dispensing the second adhesive around a perimeter of the heat spreader so that the second adhesive flows in the gap and is in contact with the first side of the mold compound and the first side of the heat spreader.

12. The method of claim 8 wherein the heat spreader includes a vent through a cross-section that is outside the portion of the heat spreader that is in contact with the first adhesive.

13. The method of claim 12, wherein the dispensing the second adhesive includes dispensing the second adhesive in the vent so that the second adhesive flows in the gap and is in contact with the first side of the mold compound and the first side of the heat spreader.

14. The method of claim 8, further comprising curing the first and second adhesives.

15. The method of claim 12, wherein the portion of the heat spreader that is in contact with the first adhesive is a downset portion that extends toward the die from the first side of the heat spreader.

16. A method comprising:
applying a first interface material on an exposed portion of an integrated circuit (IC) die mounted on a substrate;
mounting a first portion of a heat spreader on the IC die using an interface material, the heat spreader having an opening through a second portion of the heat spreader that is outside of the first portion of the heat spreader, wherein the heat spreader has a first major surface facing the IC die and a second major surface opposite the first major surface, and wherein the opening extends through the first and second major surfaces of the heat spreader; and
dispensing an adhesive between a first side of the heat spreader and a surface of an encapsulant on the substrate, wherein the interface material is different than the adhesive.

17. The method of claim 16, wherein the interface material has one of a group consisting of: different thermal properties than the adhesive and different mechanical properties than the adhesive.

18. The method of claim 16, wherein the adhesive is dispensed by one of a group consisting of: around an edge of the heat spreader, and through the opening of the heat spreader.

19. The method of claim 16, further comprising using capillary action to move the adhesive between the encapsulant and the first side of the heat spreader.

* * * * *